US006324218B1

(12) United States Patent
Jafarkhani et al.

(10) Patent No.: US 6,324,218 B1
(45) Date of Patent: Nov. 27, 2001

(54) MULTIPLE DESCRIPTION TRELLIS CODED QUANTIZATION

(75) Inventors: Hamid Jafarkhani, Middletown; Vahid Tarokh, Madison, both of NJ (US)

(73) Assignee: AT&T, New York, NY (US)

( * ) Notice: Subject to any disclaimer, the term of this patent is extended or adjusted under 35 U.S.C. 154(b) by 0 days.

(21) Appl. No.: 09/072,783

(22) Filed: May 6, 1998

Related U.S. Application Data

(60) Provisional application No. 60/071,749, filed on Jan. 16, 1998.

(51) Int. Cl.[7] ............................. H04L 5/12; H04L 23/02; H03M 13/03
(52) U.S. Cl. ..................... 375/265; 375/340; 714/792
(58) Field of Search ..................................... 375/265, 262, 375/341, 295, 340; 714/792, 794, 795; 704/242

(56) References Cited

U.S. PATENT DOCUMENTS

| | | | |
|---|---|---|---|
| 4,677,625 | * 6/1987 | Betts et al. ........................ | 714/792 |
| 4,922,507 | * 5/1990 | Simon et al. ...................... | 375/254 |
| 5,052,000 | * 9/1991 | Wang et al. ....................... | 375/265 |

OTHER PUBLICATIONS

H. A. Aksu and M. Salehi, "Multi–Stage Trellis Coded Quantization (MS–TCQ)," *Proc. Conf. Inform. Sciences & Systems*, Baltimore, Maryland, Mar. 1995.
M. W. Marcellin and T. R. Rischer, "Trellis Coded Quantization of Memoryless and Gauss–Markov Sources," *IEEE Trans. on Communications*, vol. 38, No. 1, Jan. 1990, pp. 82–93.
P. J. Sementilli et al., "Progressive Transmission in Trellis Coded Quantization–Based Image Coders," *Conf. Image Processing*, Santa Barbara, California, Oct. 1997.

H. Jafarkhani et al., "Entropy–Constrained Successively Refinable Scalar Quantization," *Proc. IEEE Data Compression Conference*, Mar. 1997, pp. 337–346.
V. A. Vaishampayan, "Design of Multiple Description Scalar Quantizers," *IEEE Trans. on Information Theory*, vol. 39, No. 3, May 1993; pp. 821–834.
V. A. Vaishampayan and J. Domaszewicz, "Design of Entropy–Constrained Multiple–Description Scalar Quantizers," *IEEE Trans. on Information Theory*, vol. 40, No. 1, Jan. 1994, pp. 245–250.

* cited by examiner

*Primary Examiner*—Stephen Chin
*Assistant Examiner*—Betsy L. Deppe
(74) *Attorney, Agent, or Firm*—Henry Brendzel

(57) ABSTRACT

A multiple description TCQ arrangement employs a trellis graph that is the tensor product, such as $T_1 \otimes T_2$, of two trellis graphs, such as $T_1$ and $T_2$. The codevectors of the tensor-product trellis, $c_i$, are incorporated within trellis graph $T_1$ and also within trellis graph $T_2$. The incorporation within trellis graph $T_1$ is effected by assigning the $c_i$ codevectors to sets, and by deriving therefrom codevectors for trellis graphs $T_1$ and $T_2$. The actual values that these codevectors take on are arranged to insure certain distortion results. Specifically, the distortion measure of the tensor-product trellis is minimized, subject to the condition that the distortion measures of approximations made by decoders operating with the $T_1$ and $T_2$ trellises do not exceed a predetermined value. Consequently, an improved arrangement is realized in which two encoders are cooperatively generating separate trellis-coded descriptions of the input sequence. Three different fidelity levels can thus be achieved: a first when only a first description is employed, a second when the second description is employed, and a third (and highest level of fidelity) when both descriptions are employed. This allows for use of receivers that are responsive to different rates, or the use of receivers that have adaptable rates.

12 Claims, 3 Drawing Sheets

MULTIPLE DESCRIPTION TRELLIS CODED QUANTIZATION

RELATED APPLICATION

This application is related to, and claims priority from, a provisional application filed on Jan. 16, 1998 which carries the Ser. No. 60/071,749. This application is also related to an application filed on even date herewith, which carries the Ser. No. 09/072,782, and is titled "Successively Refinable Trellis Coded Quantization".

BACKGROUND OF THE INVENTION

This invention relates to quantizers and, more particularly, to trellis-coded quantizers.

In recent years rate-scalable source coders have received growing attention. By selecting different sub-streams of the output of such coders, various levels of encoding rate and distortion can be achieved.

The ability to select different sub-streams is important in various applications. One such application, for example, may relate to receivers that are adapted to operate at one data rate under normal conditions, and adapted to accept a lower data rate when transmission conditions are adverse, while still producing a bona fide output, albeit, of lower fidelity.

A powerful source coding scheme for memoryless sources is trellis coded quantization. See, for example, M. W. Marcellin and T. R. Fischer, "Trellis coded quantization of memoryless and Gauss-Markov sources," *IEEE Trans. Comm.*, vol. 38, pp. 82–93, January 1990. It has been shown that for a memoryless uniform source, trellis coded quantizers (TCQs) provide mean squared errors (MSEs) within 0.21 dB of the theoretical distortion bounds (for given rates). The performance of a trellis-coded quantization (TCQ) arrangement is much better than that of the best scalar quantizer (Lloyd-Max quantizer) at the same rate.

Rate scalability can be achieved with successive refinement, as well as with multiple descriptions. Successive refinement refers to the notion of a transmitter sending one stream of data which can decode the desired signal, albeit with lower fidelity, and one or more additional streams of data that refined the decoded output. Although until now, it has been thought that trellis coding does not lend itself to successive refinability, the aforementioned co-pending application discloses a successively refinable trellis quantizer.

Multiple description refers to the notion of a transmitter sending more than one description of a given sequence. A receiver accepting one of the descriptions can reproduce the signal with a certain fidelity, and a receiver accepting both descriptions can reproduce the signal with a higher fidelity. Unlike with successive refinement, either one of the multiple descriptions can be used to decode the signal.

Multiple description scenarios have a well-established history, but no present publications exist that disclose the use of multiple description coding in the context of trellis quantization. The challenge is to realize simple and effective multiple description arrangements for trellis coding.

SUMMARY

A multiple description TCQ arrangement is achieved by employing a trellis graph that is the tensor product, such as $T_1 \otimes T_2$, of two trellis graphs, such as $T_1$ and $T_2$. The codevectors of the tensor-product trellis, $c_i$, are incorporated within trellis graph $T_1$ and also within trellis graph $T_2$. The incorporation within trellis graph $T_1$ is effected by assigning the $c_i$ codevectors to sets, and by deriving therefrom codevectors for trellis graphs $T_1$ and $T_2$. The actual values that these codevectors take on are arranged to insure certain distortion results. Specifically, the distortion measure of the tensor-product trellis is minimized, subject to the condition that the distortion measures of approximations made by decoders operating with the $T_1$ and $T_2$ trellises do not exceed a predetermined value. Consequently, an improved arrangement is realized in which two encoders are cooperatively generating separate trellis-coded descriptions of the input sequence. Three different fidelity levels can thus be achieved: a first when only a first description is employed, a second when the second description is employed, and a third (and highest level of fidelity) when both descriptions are employed. This allows for use of receivers that are responsive to different rates, or the use of receivers that have adaptable rates.

DETAILED DESCRIPTION

For sake of simplicity and ease of understanding, the trellis graph that is employed in the following disclosure is the relatively simple, four-state, trellis graph shown in FIG. 1 and described in the aforementioned Marcellin et al publication. It should be understood, however, that use of the FIG. 1 trellis graph is not a requirement of this invention. It is merely illustrative. Other one-bit-per sample trellis graphs can be used, as well as trellis graphs employing a larger number of bits per sample.

Multiple Transitions Trellis

Figure 1:
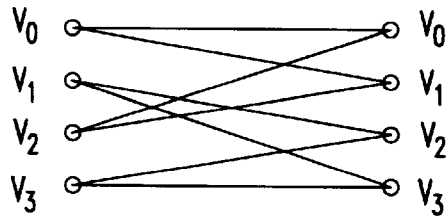
FIG. 1 shows a one-bit trellis coding graph.

The four-state trellis of FIG. 1 has two transitions from each state, and a signal level that is associated with each transition. For example, a level $c_0$ for transitions $V_0$ to $V_0$ and $V_2$ to $V_1$, $c_1$ for transitions $V_1$ to $V_2$ and $V_3$ to $V_3$, $c_2$ for transitions $V_0$ to $V_1$ and $V_2$ to $V_0$, and $c_3$ for transitions $V_1$ to $V_3$ and $V_3$ to $V_2$, where $c_0 < c_1 < c_2 < c_3$. When encoding, each input sample causes a transition in the graph from a current state to a next state, based on the signal level of the input sample and the signal levels that are associated with the transitions emanating from the current state. More specifically, in determining which transition to take, a distortion cost measure is evaluated by ascertaining the distance between the input sample and the two levels that are relevant in the current state of the trellis. The transition selected dictates the value of an output bit of the encoder. For example in state $V_1$ only levels $c_1$ and $c_3$ are relevant, and a transition from state $V_1$ to $V_3$ might indicate that the input sample is closer to level $c_3$ than to level $c_1$.

Trellises that have a larger number of signal levels, and a corresponding larger number of transitions from any one state, produce a larger number of bits per sample. Such trellises can have, but do not have to have, more than four states. Indeed, a four-state trellis of the type shown in FIG. 1 can be employed for any number of bits per sample, simply by employing parallel transitions. Accordingly, even if one were to restrict all embodiments to four-state trellis graphs, such as the one depicted in FIG. 1, the generality of the present disclosure would not be diminished. The following briefly reviews the concept of multiple transitions.

When it is desired to quantize a sequence of signal samples with R bits per sample, $2^{R+1}$ signal levels $c_i$, $i=0,1,\ldots,(2^{R+1}-1)$ are used in the trellis encoding process. In the decoding process, the received bits select from among signal levels $e_i$, $i=0,1,\ldots,(2^{R+1}-1)$, thereby approximating the sequence of input samples. Typically, the $e_i$ levels are equal to the $c_i$ levels. If levels $c_i$ are enumerated in ascending order, and if the four-transition trellis graph of FIG. 1 is to be employed for encoding, then the set of levels is partitioned into four subsets in such a manner that every fourth level belongs to the same subset, i.e. each $c_{4i+m}$ for $i=0,1,\ldots$ goes into subset $A_m$, where $m=0,1,2,3$. The levels in each subset $A_m$ are then assigned to parallel transitions from one particular state to another particular state, yielding a four-state trellis graph with multiple transitions and $2^{R+1}$ levels. Typically, the $c_i$'s and the $e_i$'s levels are scalar. Generally, however, they can be multi-dimensional vectors and, therefore, some practitioners refer to these levels as "codevectors".

Figure 2:
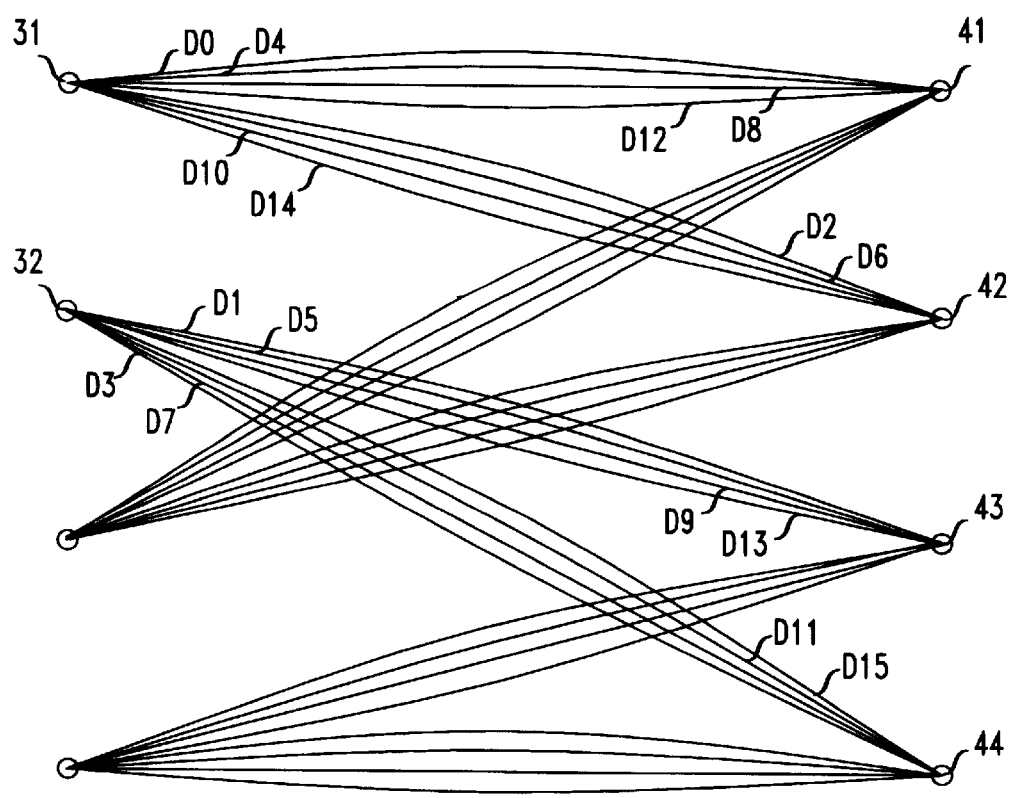
FIG. 2 presents a two-bit, four-state, trellis coding graph arrangement with parallel transitions.

To illustrate, FIG. 2 depicts a trellis graph for R=3, where there are four transitions from any one state to another state. Thus, when an encoder is residing in state 31 in FIG. 2, a label D0, D2, D4, D6, D8, D10, D12, or D14 is selected based on whether the sample to be quantized is closest to either $c_0$, $c_2$, $c_4$, $c_6$, $c_6$, $C_8$, $c_{10}$, $c_{12}$, or $c_{14}$, respectively. Labels D0, D4, D8, and D12 correspond to a transition from state 31 to state 41 in FIG. 2, and labels D2, D6, D10 and D14 correspond to a transition from state 31 to state 42 in FIG. 2. The output bits that are delivered by the quantizer are selected based on the label attached, and can be, for example, as shown in the table below:

| Transition from 31 to 41 & 42 | Output bits |
|---|---|
| D0 | 000 |
| D2 | 100 |
| D4 | 001 |
| D6 | 101 |
| D8 | 010 |
| D10 | 110 |
| D12 | 011 |
| D14 | 111 |
| Transition from 32 to 43 & 44 | |
| D1 | 000 |
| D3 | 100 |
| D5 | 001 |
| D7 | 101 |
| D9 | 010 |
| D11 | 110 |
| D13 | 011 |
| D15 | 111 |

Tensor-Product Trellis

Figure 3:
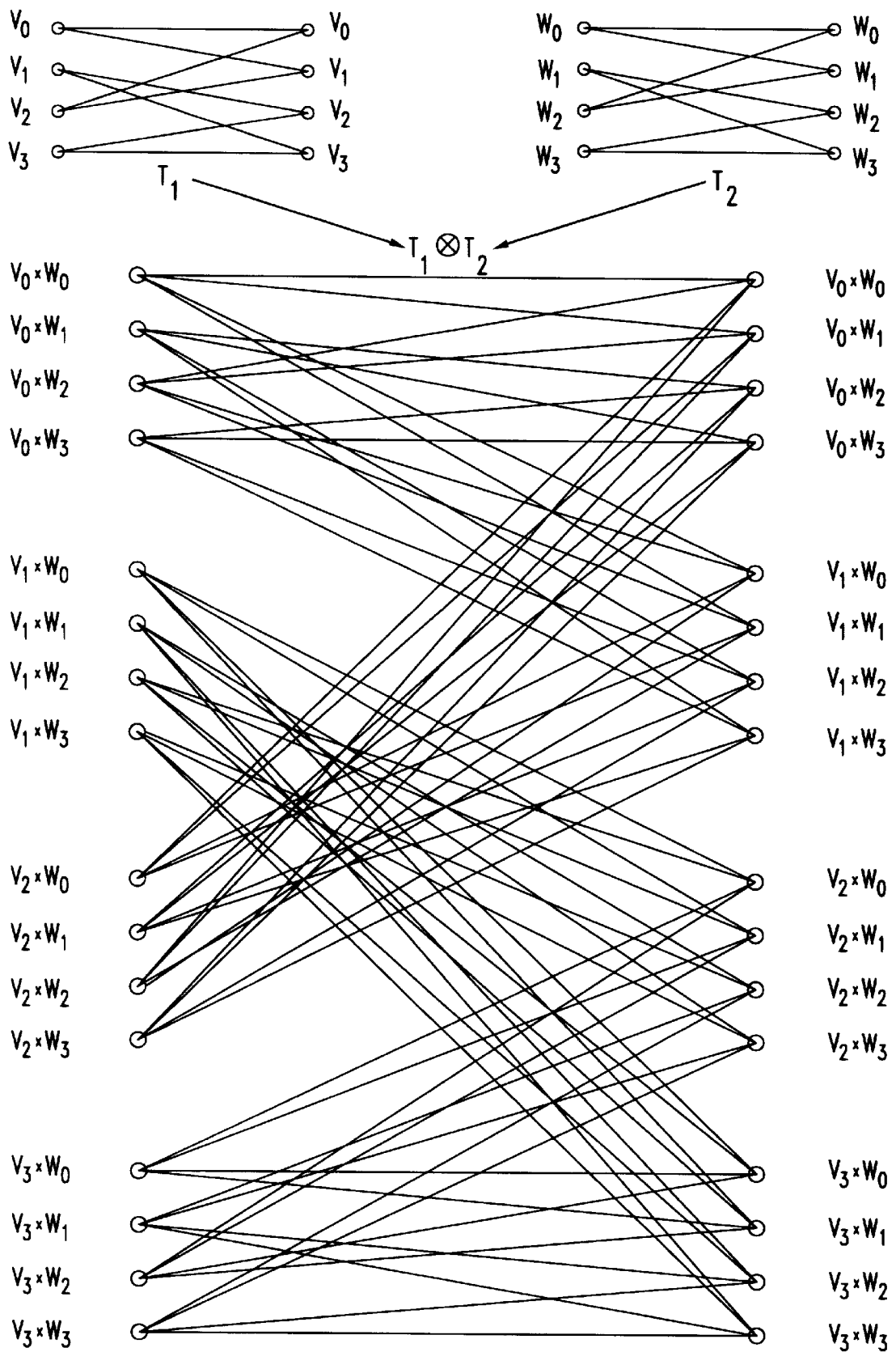
FIG. 3 illustrates the structure of a tensor-product trellis graph created from trellis graphs having the FIG. 1 structure.

If $T_1$ and $T_2$ denote trellises with states $v_1, v_2, \ldots, v_2 b1$, and $w_1, w_2, \ldots, w_2, \ldots, w_2 b2$, respectively, then the tensor-product trellis $T_1 \otimes T_2$ is a trellis with $2^{b1+b2}$ states $v_p \times w_q$, where $p=1,2,\ldots,2^{b1}$ and $q=1,2,\ldots,2^{b2}$. This is illustrated in FIG. 3 for b1=b2=2, where two four-state trellis graphs are combined to form a tensor-product trellis. As can be seen from FIG. 3, a transition between states $v_p \times w_q$ and $v_r \times w_s$ in $T_1 \otimes T_2$ exists if, and only if, there exist transitions between $v_p$ and $v_r$ in $T_1$ and between $w_q$ and $w_s$ in $T_2$. For example, there exists a transition between state $v_1 \times w_1$ of the $T_1 \otimes T_2$ graph and state $v_2 \times w_1$ of the $T_1 \otimes T_2$ graph in FIG. 3, because there exists a transition between states $v_1$ and $v_2$ in the $T_1$ trellis graph of FIG. 3, and there is also a transition between states $w_0$ and $w_0$ in the $T_2$ trellis graph of FIG. 3. This attribute allows the tensor-product trellis to be used as a TCQ that develops a multiply-descriptive output code.

In other words, it is possible to construct a trellis-coded encoder that produces a coded sequence of bits corresponding to trellis $T_1$ and a coded sequence of bits corresponding to trellis $T_2$, and a decoder that is responsive to the two-coded sequences with codevectors that are associated with the tensor-product trellis $T_1 \otimes T_2$.

Illustrative Embodiment

Figure 4:
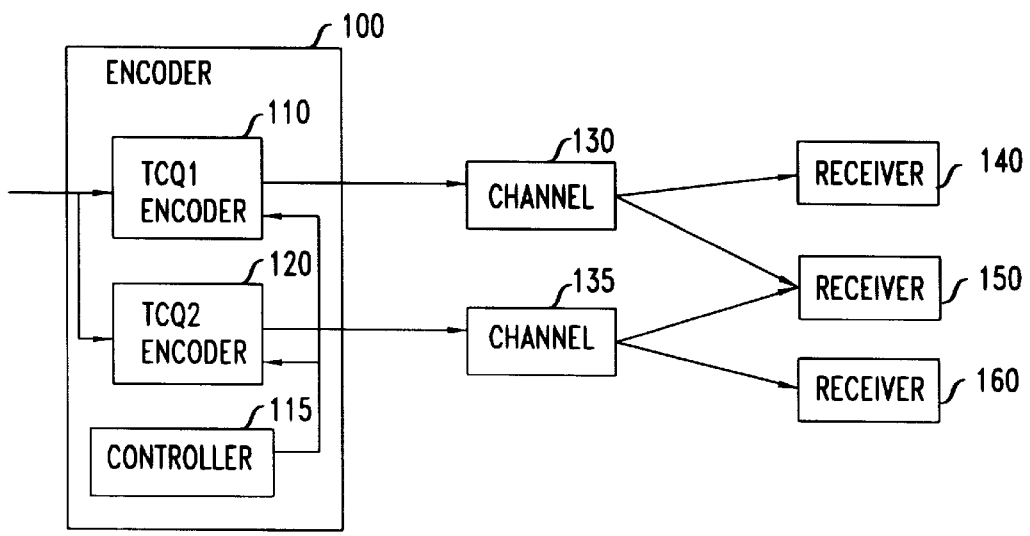
FIG. 4 depicts a block diagram of an arrangement where an encoder that produces multiple (two) descriptions of an input sequence feeds three receivers, and where one receiver is responsive to one description, a second receiver is responsive to the second description, and one receiver is responsive to both descriptions.

An illustrative physical embodiment of such an arrangement is presented in FIG. 4, where encoder 100 receiving the aforementioned input samples, includes an encoder 110 which belongs to a first TCQ (TCQ1), characterized by trellis graph $T_1$, and an encoder 120 which belongs to a second TCQ (TCQ2) characterized by trellis graph $T_2$. Encoder 100 thus outputs two distinct signals. One of the signals, passing through channel 130 and having the rate R1 bits per sample, arrives at receiver 140. That same signal passes through channel 130 as it arrives at receiver 150. The other of the signals, passing through channel 135 and having the rate R2 bits per sample, arrives at receives 160, and that same signal passes through channel 135 as it arrives at receiver 150. Receiver 140 includes a decoder for TCQ1 (employing trellis graph $T_1$), and receiver 160 includes a decoder for TCQ2 (employing trellis graph $T_2$). Receiver 150, realizing a combined, or central, TCQ (TCQ0), includes a decoder employing the tensor-product trellis $T_1 \otimes T_2$. As described more fully below, receiver 150 develops an approximation of the encoded signal with a certain, minimized, level of distortion, while receivers 140 and 160 develop an approximation of the encoded signal with a larger level of distortion than that of receiver 150. The distortion produced by receivers 140 and 160 need not be equal, however.

Although the FIG. 4 arrangement depicts three receivers, it should be understood that this depiction is primarily for the purpose of describing the encoding and decoding operations, and the design process involved. In practice, it is expected that a transmitter will be at least capable of outputting multiple descriptions, but in some applications it might not actually output those descriptions automatically. In some applications the multiple descriptions will be transmitted automatically, perhaps over disparate channels. In other applications, the multiple descriptions might be transmitted only in response to certain conditions. The control over what is transmitted by the encoders within the transmitter resides in controller 115. Controller 115 can, for example, direct the encoders to output their sequences seriatim. FIG. 4 shows two TCQ encoders on the encoding side, but it should be understood that a larger number of TCQ encoders are possible, with each providing its own description of the input sequence of samples. Obviously, receiver 150 that includes a decoder for TCQ0 that employs tensor-product trellis $T_1 \otimes T_2$ can be easily converted to a receiver that decodes TCQ1 or TCQ2.

On the decoding side, in some applications one may find three kinds of receivers that are used concurrently by different users. A receiver may be adapted to decode the sequence that arrives at the rate R1bits per sample (one description), another receiver may be adapted to decode the sequence that arrives at the rate R2 bits per sample (another description), and still another receiver may be adapted to decode the sequence that arrives at the rate R1+R2 bits per sample. In other applications, receivers may be adapted to accept any of the above three rates, based, perhaps, on channel conditions or wishes of the user. More particularly, a receiver may be adapted to accept any subset of the multiple descriptions and create an output that is based on the received (i.e., received without errors that are not correctable) descriptions.

Trellis Codevectors

Returning to the design issues of the three TCQs, the variables that need to be ascertained are a) codevectors employed in encoder 110 and receiver 140 (codevectors $b^1_k$ for TCQ1);

b) codevectors employed in encoder 120 and receiver 160 (codevectors $b^2_j$ for TCQ2); and c) codevectors employed in receiver 150 (codevectors $c_i$ for TCQ0).

It is clear that codevectors $c_i$ need to be selected to produce a good output at receiver 150, and codevectors $b^1_k$ and $b^2_j$ need to be selected to produce a good output at receivers 140 and 160, respectively. Of course, one would rightly expect that receiver 150, which is responsive to more information, would produce an output with less distortion than the distortion at the outputs of receivers 140 and 160, which are responsive to less information. In deciding on the proper values of $c_i$, $b^1_k$, and $b^2_j$, one could select the $b^1_k$ and $b^2_j$ codevectors that independently produce the lowest distortion out of receivers 140 and 160, respectively, and then decide on the $c_1$ codevectors that would give the lowest distortion at the output of receiver 150, given the fact that the signal was encoded with the previously selected $b^1_k$ and $b^2_j$ codevectors. Thereafter, one would undertake a refinement process to modify the selected codevectors so as to improve the distortion measure at the output of receiver 150, at the cost of degrading the performance at the output of receivers 140 and 160, to insure that receiver 150 provides the least-distorted output.

Conversely, one could select the $c_i$ codevectors that would give the lowest distortion at the output of receiver 150, then select the $b^1_k$ and $b^2_j$ codevectors and ascertain whether some preselected maximum level of distortion has been exceeded. If so, one would undertake a refinement process to modify the selected $c_i$ codevectors, and corresponding $b^1_k$ and $b^2_j$ codevectors, to improve performance at the output of receivers 140 and 160, at the expense of performance at the output of receiver 150.

We have ascertained that a relationship exists between the $c_i$ codevectors and the $b^1_k$, and $b^2_j$ codevectors, and in accordance with the principles disclosed herein, the $c_i$, $b^1_k$, and $b^2_j$ codevectors are determined concurrently.

Proceeding with the relationship between $b^1_k$, $b^2_j$, and $c_i$, codevectors $c_i$ are partitioned into two groups. The first group, set aside for TCQ1, contains $2^{R_1+1}$ subsets $B^1_k$, $k=0,1,\ldots,(2^{R_1+1}-1)$, where each subset consists of $2^{R_1+1}$ $c_i$'s. Similarly, the second group, set aside for TCQ2, contains $2^{R_2+1}$ subsets $B^2_j$, where each subset consists of $2^{R_1+1}$ $c_i$'s. To illustrate, when R1=R2=1, the partitioning results in four subsets $B^1_0$, $B^1_1$, $B^1_2$, and $B^1_3$ for TCQ1, and four subsets $B^2_0$, $B^2_1$, $B^2_2$, and $B^2_3$ for TCQ2.

When R1 or R2 is greater than 1, the number of subsets in the corresponding group is a higher power of two, and is divisible by four. If, as indicated above, the designer wishes to employ a four-state trellis with parallel transitions, such as in FIG. 2, then a subset having more than four members is itself partitioned into four subsets $A^1_m$ and/or $A^2_m$, to create a TCQ1, or a TCQ2, as the case may be, with multiple transitions.

Every pair of paths in $T_1$ and $T_2$ identifies a path in $T_1 \otimes T_2$, and it corresponds to a path of length N in $T_1$ and a path of length N in $T_2$. The transitions in $T_1$ correspond to codevectors selected from $b^1_0$, $b^1_1$, $b^1_2$, and $b^1_3$ which are derived from subsets $B^1_0$, $B^1_1$, $B^1_2$, and $B^1_3$, respectively. Likewise, the transitions in $T_2$ correspond to codevectors selected from $b^2_0$, $b^2_1$, $b^2_2$, and $b^2_3$, which are derived from subsets $B^2_0$, $B^2_1$, $B^2_2$, and $B^2_3$, respectively. More specifically, the $b^1_k$ levels correspond to the centroids of $B^1_k$, and the $b^2_j$ levels correspond to the centroids of $B^2_j$.

In the context of this disclosure, the centroid of a subset corresponds to the sum of all members of the set, $c_i$, each multiplied by a fraction that corresponds to the area under the probability distribution of the input signals, in the region where input signals are closer to member $c_i$ than to any other member of the set. For example, a simple illustrative probability distribution for input signals might be triangular in shape, beginning with 0 at −1.0, increasing linearly to a maximum of 1.0 at 0, and then decreasing linearly to 0 at +1.0. Given, for example, a subset containing members {−0.8, −0.7, −0.6, −0.5}, the four resulting intervals are −1.0 to −0.75, −0.75 to −0.65, −0.65 to −0.55, and −0.55 to +1.0. The centroid would then be $$-\left(0.8 \cdot \frac{0.25^2}{2}\right) - (0.7)(0.1)(0.3) -$$
$$(0.6)(0.1)(0.4) - (0.5) \cdot \left(\frac{1.45 \cdot 0.55}{2} + 0.5\right) = -0.522775$$

The $n^{th}$ transition in the TCQ0 trellis is defined by the codevector that remains from the intersection of the B subsets (i.e., $B^1_k \cap B^2_j$) that are involved in the $n^{th}$ transition of TCQ1 and TCQ2. Clearly, then, the assignment of codevectors $c_i$ to sets $B^1_k$ and $B^2_j$ should be such that $B^1_k \cap B^2_j$ is non-zero, and unique for all i and j. This translates to a requirement that precisely one $c_i$ should be shared between any pair of $B^1_k$ and $B^2_j$. This, in turn, means that members of any particular subset $B^1_k$ must be members in different ones of subsets $B^2_j$. A simple way to achieve such an assignment is to use a two-dimensional table, such as the one shown in FIG. 5, where each row specifies the $c_i$'s that are assigned for a particular $b^1_k$ of TCQ1, and each column specifies the $c_i$'s that are assigned for a particular $b^2_j$ of TCQ2.

Figure 5:
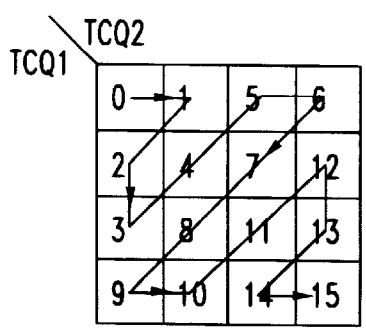
FIG. 5 shows a heuristic approach for making index assignments.

Heuristically, it has been shown that a reasonable starting assignment is achieved by ordering the $c_i$'s in ascending order and by assigning the ordered $c_i$'s in accordance with a path such as the one outlined in FIG. 5. With reference to FIG. 3, the assignments in FIG. 5 correspond to transition assignments expressed in the following Table 1.

TABLE 1

| | $b_0^1$ | $b_1^1$ | $b_2^1$ | $b_3^1$ |
|---|---|---|---|---|
| | $\underline{c_0}$ | $\underline{c_1}$ | $\underline{c_5}$ | $\underline{c_6}$ |
| $b_0^2$ | $v_0 \times w_0 \to v_0 \times w_0$ | $v_0 \times w_1 \to v_0 \times w_2$ | $v_0 \times w_0 \to v_0 \times w_1$ | $v_0 \times w_1 \to v_0 \times w_3$ |
| | $v_0 \times w_2 \to v_0 \times w_1$ | $v_0 \times w_3 \to v_0 \times w_3$ | $v_0 \times w_2 \to v_0 \times w_0$ | $v_0 \times w_3 \to v_0 \times w_2$ |
| | $v_2 \times w_0 \to v_1 \times w_0$ | $v_2 \times w_1 \to v_1 \times w_2$ | $v_2 \times w_0 \to v_1 \times w_1$ | $v_2 \times w_1 \to v_1 \times w_3$ |
| | $v_2 \times w_2 \to v_1 \times w_0$ | $v_2 \times w_3 \to v_1 \times w_3$ | $v_2 \times w_2 \to v_1 \times w_0$ | $v_2 \times w_3 \to v_1 \times w_2$ |
| | $\underline{c_2}$ | $\underline{c_4}$ | $\underline{c_7}$ | $\underline{c_{12}}$ |
| $b_1^2$ | $v_1 \times w_0 \to v_2 \times w_0$ | $v_1 \times w_1 \to v_2 \times w_2$ | $v_1 \times w_0 \to v_2 \times w_1$ | $v_1 \times w_1 \to v_2 \times w_3$ |
| | $v_1 \times w_2 \to v_2 \times w_1$ | $v_1 \times w_3 \to v_2 \times w_3$ | $v_1 \times w_2 \to v_2 \times w_0$ | $v_1 \times w_3 \to v_2 \times w_2$ |
| | $v_3 \times w_0 \to v_3 \times w_0$ | $v_3 \times w_1 \to v_3 \times w_2$ | $v_3 \times w_0 \to v_3 \times w_1$ | $v_3 \times w_1 \to v_3 \times w_3$ |
| | $v_3 \times w_2 \to v_3 \times w_1$ | $v_3 \times w_3 \to v_3 \times w_3$ | $v_3 \times w_2 \to v_3 \times w_0$ | $v_3 \times w_3 \to v_3 \times w_2$ |
| | $\underline{c_3}$ | $\underline{c_8}$ | $\underline{c_{11}}$ | $\underline{c_{13}}$ |
| $b_2^2$ | $v_0 \times w_0 \to v_1 \times w_0$ | $v_0 \times w_1 \to v_1 \times w_2$ | $v_0 \times w_0 \to v_1 \times w_1$ | $v_0 \times w_1 \to v_1 \times w_3$ |
| | $v_0 \times w_2 \to v_1 \times w_1$ | $v_0 \times w_3 \to v_1 \times w_3$ | $v_0 \times w_2 \to v_1 \times w_0$ | $v_0 \times w_3 \to v_1 \times w_2$ |
| | $v_2 \times w_0 \to v_0 \times w_0$ | $v_2 \times w_1 \to v_0 \times w_2$ | $v_2 \times w_0 \to v_0 \times w_1$ | $v_2 \times w_1 \to v_0 \times w_3$ |
| | $v_2 \times w_2 \to v_0 \times w_1$ | $v_2 \times w_3 \to v_0 \times w_3$ | $v_2 \times w_2 \to v_0 \times w_0$ | $v_2 \times w_3 \to v_0 \times w_2$ |
| | $\underline{c_9}$ | $\underline{c_{10}}$ | $\underline{c_{14}}$ | $\underline{c_{15}}$ |
| $b_3^2$ | $v_1 \times w_0 \to v_3 \times w_0$ | $v_1 \times w_1 \to v_3 \times w_2$ | $v_1 \times w_0 \to v_3 \times w_1$ | $v_1 \times w_1 \to v_3 \times w_3$ |
| | $v_1 \times w_2 \to v_3 \times w_1$ | $v_1 \times w_3 \to v_3 \times w_3$ | $v_1 \times w_2 \to v_3 \times w_0$ | $v_1 \times w_3 \to v_3 \times w_2$ |
| | $v_3 \times w_0 \to v_2 \times w_0$ | $v_3 \times w_1 \to v_2 \times w_2$ | $v_3 \times w_0 \to v_2 \times w_1$ | $v_3 \times w_1 \to v_2 \times w_3$ |
| | $v_3 \times w_2 \to v_2 \times w_1$ | $v_3 \times w_3 \to v_2 \times w_3$ | $v_3 \times w_2 \to v_2 \times w_0$ | $v_3 \times w_3 \to v_2 \times w_2$ |

Table 2 below shows the correspondence between the codevectors of TCQ0 and the codevectors for TCQ1 and TCQ2 for the assignments made in FIG. 5.

TABLE 2

| TCQ0 | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| TCQ1 | 0 | 0 | 1 | 2 | 1 | 0 | 0 | 1 | 2 | 3 | 3 | 2 | 1 | 2 | 3 | 3 |
| TCQ2 | 0 | 1 | 0 | 0 | 1 | 2 | 3 | 2 | 1 | 0 | 1 | 2 | 3 | 3 | 2 | 3 |

Consequently, the $c_i$'s that are assigned to subsets $B^1_k$ and $B^2_j$ are:

$B^1_0=\{c_0,c_1,c_5,c_6\}$ $B^2_0=\{c_0,c_2,c_3,c_9\}$ $B^1_1=\{c_2,c_4,c_7,c_{12}\}$ $B^2_1=\{c_1,c_4,c_8, c_{10}\}$ $B^1_2=\{c_3,c_8,c_{11},c_{13}\}$ $B^2_2=\{c_5,c_7,c_{11},c_{14}\}$ $B^1_3=\{c_9,c_{10},c_{14},c_{15}\}$ $B^2_3=\{c_6,c_{12},c_{13},c_{15}\}$

To complete the design, the actual values of the $c_i$, $b^1_k$, and $b^2_j$ codevectors need to be selected and, in accordance with the principle disclosed above, concurrently optimized for signals having a particular signal probability distribution. Thus, the codevectors need to be optimized in conformance with the objective to minimize the distortion measure D of TCQ0, subject to the condition that the resulting distortion measure D1 of TCQ1 is not greater than d1 and the resulting distortion measure D2 of TCQ2 is not greater than d2.

Using Lagrange multipliers $\lambda_1$ and $\lambda_2$, the above-expressed constrained minimization problem can be converted to a non-constrained minimization problem of the form:

$$\min \{D + \lambda_1 D_1 + \lambda_2 D_2\} \qquad (1)$$

For a given pair of multipliers $\lambda_1$ and $\lambda_2$, and a training sequence x(n) with N samples, an illustrative distortion measure cost function can be expressed by $$J = \frac{1}{N}\sum_{n=1}^{N}[x(n)-\hat{x}(n)]^2 + \lambda_1[x(n)-\hat{x}^1(n)]^2 + \lambda_2[x(n)-\hat{x}^2(n)]^2, \qquad (2)$$

where $\hat{x}(n)$ is the decoded approximation of sample x(n) in TCQ0, $\hat{x}^1(n)$ is the decoded approximation of sample x(n) in TCQ1, and $\hat{x}^2(n)$ is the decoded approximation of sample x(n) in TCQ2. The objective, then, is to minimize the combined distortion measure, J, by iteratively modifying the values of codevectors $b^1_k$, $b^2_j$, and $c_i$ until the distortion constraints are met, and further modifications fail to sufficiently improve the value of J to merit continued modifications.

In the process of optimizing the values of codevectors $c_i$, $b^1_k$, and $b^2_j$, if $Y_i$ is the set of all training samples which are encoded as $c_i$ in TCQ0, and $|Y_i|$ is the number of elements in set $Y_i$, then replacing each codevector $c_i$ with a new codevector $\tilde{c}_i$ defined by $$\tilde{c}_i = \frac{1}{|Y_i|}\sum_{x(n) \in Y_i} x(n), \qquad (3)$$

results in a lower distortion D, when the same path and codewords which have been used for the old codevectors are utilized. Note that since we are dealing with a trellis coder, the fact that some $x(n) \in Y_i$ does not necessarily means that $c_i$ is the closest codevector to x(n). As the $c_i$ values are modified in each iteration, the corresponding $b^1_k$, and $b^2_j$ values are also modified, as disclosed above.

Figure 6:
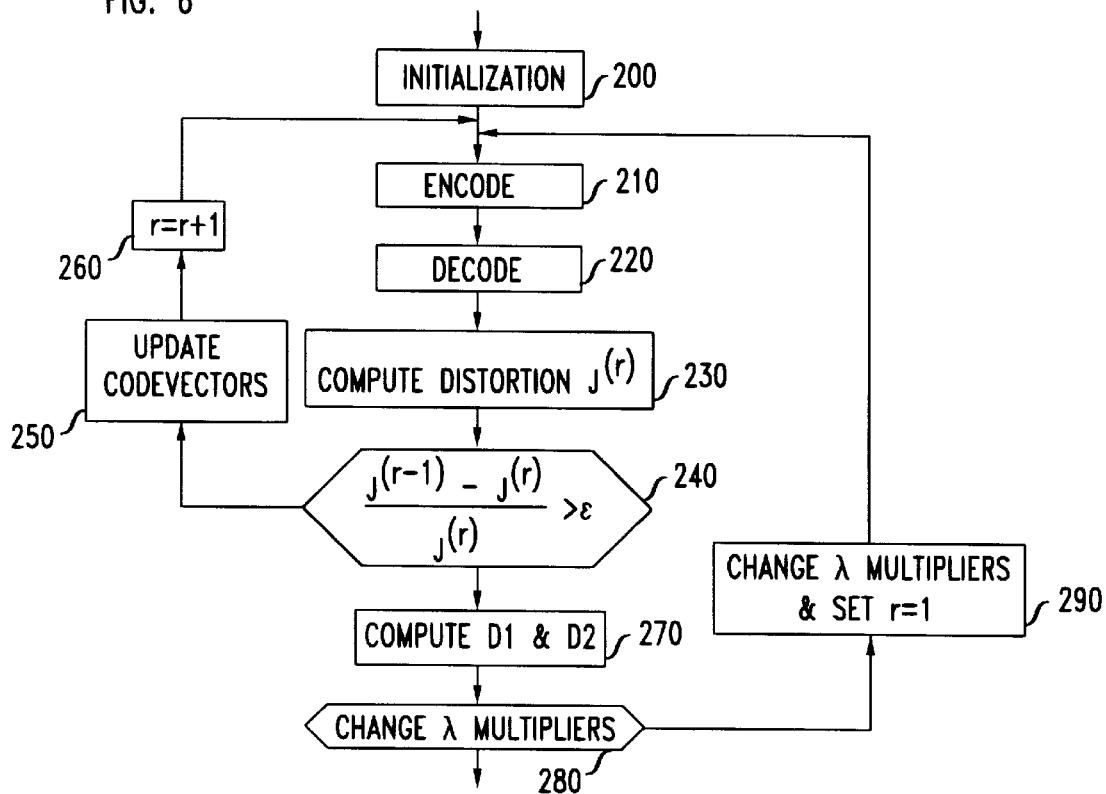
FIG. 6 presents an algorithm for ascertaining optimized encoder threshold levels.

FIG. 6 presents a flow chart of the process for ascertaining the actual $c_i$, $b^1_k$, and $b^2_j$ values. Block 200 is the initialization block. This block identifies the probability distribution for the input signals and, in conformance with that distribution, selects a training sequence. It then chooses an initial set of $C_i$ codevectors, and computes an initial set of $b^i_k$, and $b^2_j$ codevectors. It selects $\lambda_1$ and $\lambda_2$, sets the $0^{th}$ iteration of the distortion measure, $J^{(O)}$, to a large number, and sets iteration index r to 1. Control then passes to block 210 where the training sequence is encoded, using the Viterbi algorithm, using equation (2) as the distortion measure. Block 220 decodes the encoded signals using codevectors $c_i$, $b^1_j$, and $b^2_j$ to obtain sequences $\hat{x}(n)$, $\hat{x}^1(n)$, and $\hat{x}^2(n)$, respectively, and block 230 computes $J^{(r)}$. Decision block 240 evaluates $$\frac{J^{(r-1)} - J^{(r)}}{J^{(r)}},$$

which is a measure of improvement in distortion measure, J, and compares it to a preselected threshold, $\epsilon$. If the measure of improvement is greater than $\epsilon$, control passes to block 250 which updates codevectors $c_i$ in accordance with equation (3), and correspondingly updates codevectors $b^1_k$, and $b^2_j$. Thereafter, the index r is incremented in block 260, and control returns to block 210. If the measure of improvement is not greater than $\epsilon$, then the iterative process for the selected Lagrange multipliers terminates. Block 270 then computes distortions D1 and D2 by evaluating $$D1 = \frac{1}{N} \sum_{n=1}^{N} [x(n) - \hat{x}^1(n)]^2 \qquad (4)$$

and $$D2 = \frac{1}{N} \sum_{n=1}^{N} [x(n) - \hat{x}^2(n)]^2. \qquad (5)$$

Block 280 determines whether either one of the distortions is greater than the maximum specified distortion (e.g., the condition is TRUE if D1>d1). If so, control passes to block 290, where the corresponding Lagrange multiplier is reduced (in this example, $\lambda_1$) to allow that component to have greater effect in the calculations of equation (2). Block 290 also resets the iteration index, r, to 1, and returns control to block 210. The process is repeated until both D1 and D1 are not greater than d1 and d2, respectively.

Since the FIG. 6 process alters the $c_i$ levels, it is possible that the order of the $c_i$ thresholds might change. For example, it is possible that the value of $c_5$ has grown to be larger than $c_7$ and that the value of $c_4$ has become less than the value of $c_3$. Repositioning the TCQ1 and TCQ2 codevectors, the altered table would be And the new set of assignments for $B^1_k$ and $B^2_j$ becomes:

$B^1_0=\{c_0,c_1,c_5,c_7\}$  $B^2_0=\{c_0,c_2,c_4,c_9\}$ $B^1_1=\{c_2,c_3,c_6,c_{12}\}$  $B^2_1=\{c_1,c_3,c_8,c_{10}\}$ $B^1_2=\{c_4,c_8,c_{11},c_{13}\}$  $B^2_2=\{c_5,c_6,c_{11},c_{14}\}$ $B^1_3=\{c_9,c_{10},c_{14},c_{15}\}$  $B^2_3=\{c_7,c_{12},c_{13},c_{15}\}$

The above disclosure illustrates the principles of this invention; however, various modifications and enhancements can be introduced by artisans without departing from the spirit and scope of this invention, which is defined by the following claims. For example, the trellises that form the "building-blocks" of the tensor trellis can be replaced with other trellises, and do not have to be the same as the trellises. Also, although the above discloses the principles of this invention in the context of trellis coded quantization (TCQ) using scalar levels, it should be understood that these principles also apply to vectors (TCVQ), to entropy-coded TCQ, and to entropy-coded TCVQ. The generalized class that includes TCQ, TCVQ, entropy-coded TCQ, and entropy-coded TCVQ is termed herein GTCQ.

We claim:

1. Apparatus comprising:
   a first GTCQ encoder that encodes an input sequence to develop a first encoded description;
   a second GTCQ encoder that encodes said input sequence to develop a second encoded description;
   where the encoding performed in said first GTCQ encoder and the encoding performed in said second GTCQ encoder are performed by considering a distortion measure that concurrently accounts for distortions created in said first GTCQ encoder and in said second GTCQ encoder.

2. The apparatus of claim 1 where said distortion measure, J, is expressed by a combination that includes
   samples $\hat{x}(n)$, which are decoded approximations of input samples $x(n)$ in a receiver that is responsive to said first encoded description and to said second encoded description,
   samples $\hat{x}^1(n)$, which are decoded approximations of sample $x(n)$ in a receiver that is responsive to said first encoded description, and
   samples $\hat{x}^2(n)$, which are decoded approximations of sample $x(n)$ in a receiver that is responsive to said second encoded description.

3. The apparatus of claim 2 where said distortion measure, J, is expressed by $$J = \frac{1}{N} \sum_{n=1}^{N} [x(n) - \hat{x}(n)]^2 + \lambda_1 [x(n) - \hat{x}^1(n)]^2 + \lambda_2 [x(n) - \hat{x}^2(n)]^2,$$

where N is the number of samples in an encoded frame of samples in said input sequence, and $\lambda_1$ and $\lambda_2$ are preselected constants.

4. The apparatus of claim 1 where said first GTCQ encoder employs codevectors $b^1_k$, and said second GTCQ

TABLE 3

| TCQ | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| TCQ1 | 0 | 0 | 1 | 1 | 2 | 0 | 1 | 0 | 2 | 3 | 3 | 2 | 1 | 2 | 3 | 3 |
| TCQ2 | 0 | 1 | 0 | 1 | 0 | 3 | 2 | 2 | 1 | 0 | 1 | 2 | 3 | 3 | 2 | 3 | encoder employs codevectors $b^2_j$, wherein both of these codevectors, related to a set of codevectors $c_i$, where k is an index $\{0, 1, \ldots 2^{R1+1}-1\}$ and R1 is the number of bits per sample created in said first GTCQ encoder, j is an index $\{0, 1, \ldots 2^{R2+1}\}$ and R2 is the number of bits per sample created in said second GTCQ encoder, and i in an index $\{0, 1, \ldots 2^{R1+R2+2}-1\}$.

5. The apparatus of claim 4 where said $b^1_k$ codevectors and said $b^2_j$ codevectors are related to distinct subsets of said $c_i$ codevectors.

6. Apparatus comprising:

a receiver for accepting an M plurality of encoded sequences; and a GTCQ decoder employing an M order tensor-product trellis graph, $T_1 \otimes T_2 \otimes T_3 \otimes \ldots \otimes T_M$, which corresponds to a tensor-product of M GTCQ trellis graphs said decoder being responsive to said M plurality of encoded sequences.

7. The apparatus of claim 6 where M=2, the tensor-product trellis graph is $T_1 \otimes T_2$, where $T_1$ is a GTCQ trellis graph employed in developing one of said M plurality of encoded sequences, and where $T_2$ is a GTCQ trellis graph employed in developing another of said M plurality of encoded sequences.

8. The apparatus of claim 7 where said tensor product trellis graph employs codevectors $C_i$, said $T_1$ GTCQ trellis graph employs codevectors $b^1_k$, and said $T_2$ GTCQ trellis graph employs codevectors $b^2_j$, where the $b^1_k$ and $b^2_j$ codevectors are related to distinct subsets of codevectors $c_i$.

9. The apparatus of claim 8 where the $b^1_k$ and $b^2_j$ codevectors are centroids of distinct subsets of codevectors $c_i$.

10. The apparatus of claim 6 further comprising control means for directing a transmitter to transmit said M plurality of encoded sequences seriatim.

11. The apparatus of claim 6 where said GTCQ decoder is modifiable to employ a tensor-product trellis graph of order lower than M, and further comprising control means for identifying a subset of K sequences from said M plurality of encoded sequences, and for modifying said GTCQ decoder to employ a K order tensor-product trellis graph, $T_1 \otimes T_2 \otimes T_3 \otimes \ldots \otimes T_k$, where K is any integer from 1 to M.

12. The apparatus of claim 11 where said GTCQ decoder is modifiable to employ a tensor-product GTCQ trellis graph $T_1 \otimes T_2$, a GTCQ trellis graph $T_1$, or a GTCQ trellis graph $T_2$.

* * * * *

UNITED STATES PATENT AND TRADEMARK OFFICE
CERTIFICATE OF CORRECTION

PATENT NO. : 6,324,218 B1
DATED : November 27, 2001
INVENTOR(S) : Hamid Jafarkhani and Vahid Tarokh Page 1 of 1

It is certified that error appears in the above-identified patent and that said Letters Patent is hereby corrected as shown below:

Column 11,
Line 5, "$\{0, 1, \ldots 2^{R2+1}\}$" should read -- $\{0, 1, \ldots 2^{R2+1}-1\}$ --
Line 27, "$C_i$," should read -- $c_i$, --

Signed and Sealed this

Thirtieth Day of April, 2002

Attest:

Attesting Officer

JAMES E. ROGAN
*Director of the United States Patent and Trademark Office*